US008618577B2

(12) United States Patent
Imada

(10) Patent No.: US 8,618,577 B2
(45) Date of Patent: Dec. 31, 2013

(54) COMPOUND SEMICONDUCTOR DEVICE AND MANUFACTURING METHOD THEREOF

(75) Inventor: Tadahiro Imada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 335 days.

(21) Appl. No.: 13/091,322

(22) Filed: Apr. 21, 2011

(65) Prior Publication Data
US 2011/0193096 A1 Aug. 11, 2011

Related U.S. Application Data

(63) Continuation of application No. PCT/JP2008/069676, filed on Oct. 29, 2008.

(51) Int. Cl.
H01L 29/66 (2006.01)
(52) U.S. Cl.
USPC .......................... 257/192; 257/615; 438/167
(58) Field of Classification Search
None
See application file for complete search history.

(56) References Cited

U.S. PATENT DOCUMENTS

| 5,485,017 A | 1/1996 | Nishizawa | |
|---|---|---|---|
| 2005/0258450 A1* | 11/2005 | Saxler | 257/192 |
| 2006/0226412 A1 | 10/2006 | Saxler et al. | |
| 2008/0128862 A1* | 6/2008 | Sugimoto et al. | 257/615 |
| 2009/0315037 A1* | 12/2009 | Kikkawa | 257/76 |

FOREIGN PATENT DOCUMENTS

| JP | 61-091965 A | 5/1986 |
|---|---|---|
| JP | 7-030073 A | 1/1995 |
| JP | 2006-140368 A | 6/2006 |
| JP | 2007-273597 A | 10/2007 |
| JP | 2008-177515 A | 7/2008 |
| JP | 2008-218813 A | 9/2008 |

OTHER PUBLICATIONS

JP2007273597A, Machine Translation.*
Kanechika M. et al. "A Vertical Insulated Gate AlGaN/GaN Heterojunction Field-Effect Transistor," Japanese Journal of Applied Physics, 2007, vol. 46 No. 21, pp. L503-L505.
International Search Report of PCT/JP2008/069676, mailing date Jan. 27, 2009.
Notification of Transmittal of Translation of the International Preliminary Report on Patentability (form PCT/IB/338) of International Application No. PCT/JP2008/069676 mailed Jun. 16, 2011 with Forms PCT/IB/373 and PCT/ISA/237.
Extended European Search Report dated Aug. 10, 2012, issued in corresponding European Patent Application No. 08 87 7732.1, (8 pages).

* cited by examiner

Primary Examiner — Andres Munoz
(74) Attorney, Agent, or Firm — Westerman, Hattori, Daniels & Adrian, LLP

(57) ABSTRACT

An n-type GaN layer (3), a GaN layer (7) formed over the n-type GaN layer (3), an n-type AlGaN layer (9) formed over the GaN layer (7), a gate electrode (15) and a source electrode (13) formed over the n-type AlGaN layer (9), a drain electrode (14) formed below the n-type GaN layer (3), and a p-type GaN layer (4) formed between the GaN layer (7) and the drain electrode (14) are provided.

16 Claims, 15 Drawing Sheets

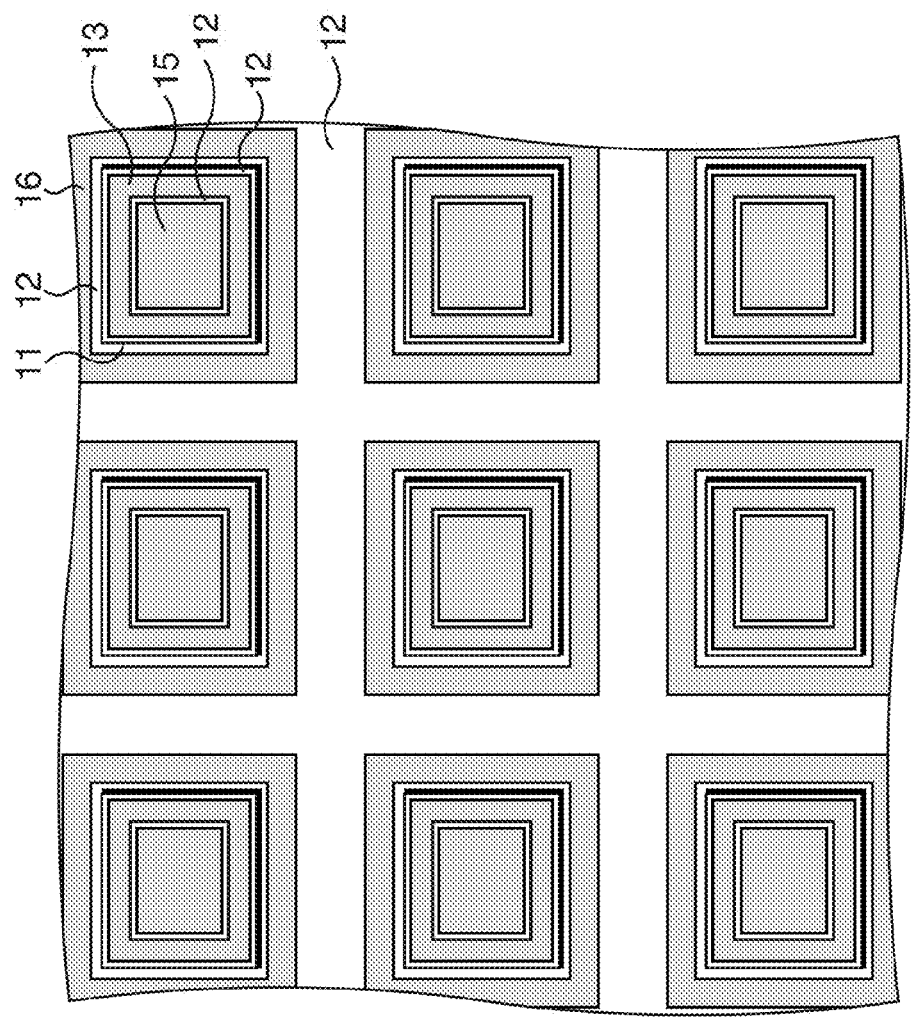

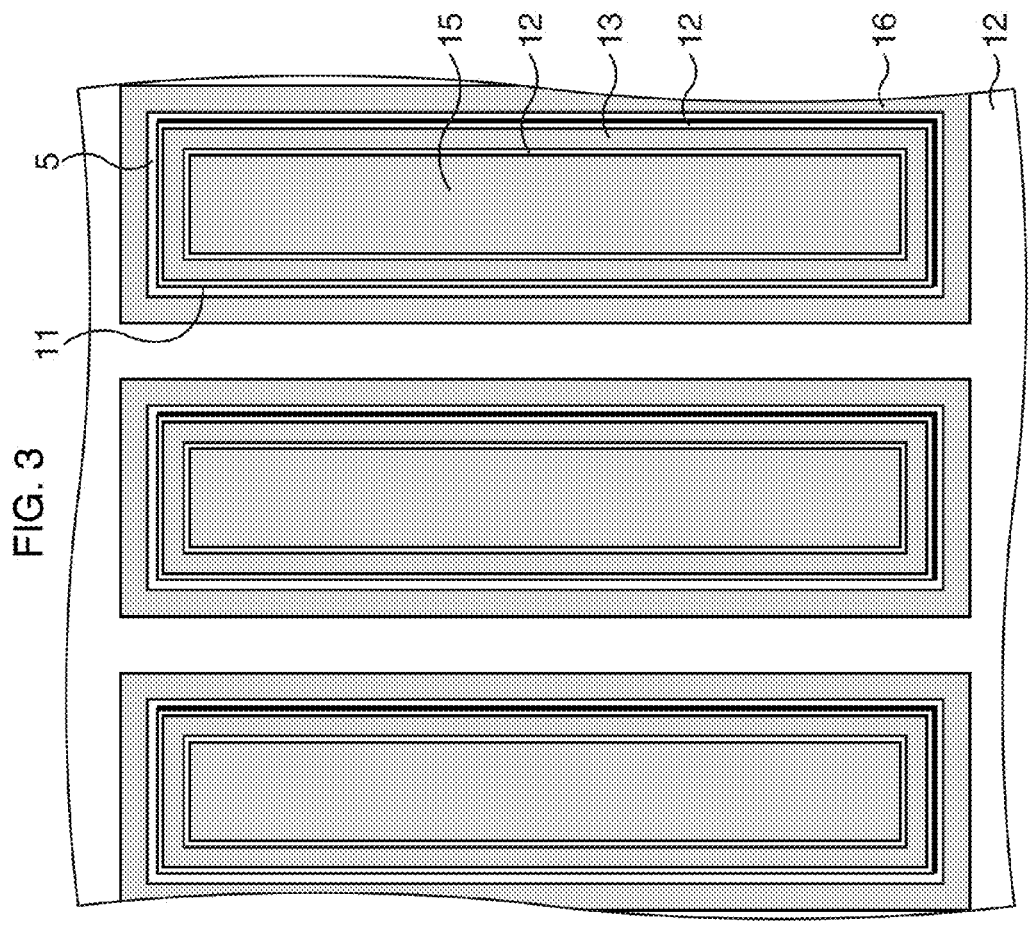

COMPOUND SEMICONDUCTOR DEVICE AND MANUFACTURING METHOD THEREOF

CROSS-REFERENCE TO RELATED APPLICATIONS

This application is a Continuation of International Application No. PCT/JP2008/069676, with an international filing date of Oct. 29, 2008, which designating the United States of America, the entire contents of which are incorporated herein by reference.

TECHNICAL FIELD

The present invention relates to a compound semiconductor device and a manufacturing method thereof.

BACKGROUND ART

Conventionally, there has been conducted a research regarding a high electron mobility transistor (HEMT), in which an AlGaN layer and a GaN layer are formed over a substrate through crystal growth, and the GaN layer functions as an electron transit layer. A band gap of GaN is 3.4 eV, which is larger than a band gap of GaAs (1.4 eV). For this reason, a GaN-based HEMT has a high withstand voltage, and it is promising as a high withstand voltage electronic device for automobiles and so on.

Further, as structures of the GaN-based HEMT, there are a horizontal structure, in which a source and a drain are disposed in parallel to a surface of a substrate, and a vertical structure, in which a source and a drain are disposed perpendicular to a surface of a substrate.

In the vertical structure, since a current path becomes three-dimensional, it is possible to increase a current amount per chip compared to the horizontal structure. Further, a drain electrode and a source electrode are positioned at top and bottom of the substrate, so that even when areas of these electrodes are enlarged, it is easy to reduce an area of the chip. Therefore, even when the areas of the drain electrode and the source electrode are enlarged for letting a large current flow, the area of the chip hardly increases. In addition, since a ratio of metal per chip is increased, a heat release characteristic is improved.

In the GaN-based HEMT, even when a voltage is not applied to a gate, a current flows in a channel because two-dimensional electron gas resulting from a difference in lattice constants between a GaN layer and an AlGaN layer exists. Specifically, a normally-on operation is performed. Meanwhile, it is also conceivable that a current flows between the source and the drain when a power is turned on, when the gate electrode is broken or the like, in which 0 V is unintentionally applied to the gate electrode. Accordingly, a normally-off operation of the GaN-based HEMT is desired also from a point of view of fail-safe.

Patent Document 1: Japanese Laid-open Patent Publication No. 2006-140368

Non-Patent Document 1: Japanese Journal of Applied Physics vol. 46, No. 21, 2007, pp. L503 to L505

SUMMARY OF THE INVENTION

An aspect of a compound semiconductor device includes: a first compound semiconductor layer of a first conductivity type; an electron transit layer formed over the first compound semiconductor layer; an electron supply layer formed over the electron transit layer; a gate electrode and a source electrode formed over the electron supply layer; and a drain electrode formed below the first compound semiconductor layer. Further, the compound semiconductor device includes: a second compound semiconductor layer of a second conductivity type different from the first conductivity type, formed between the electron transit layer and the drain electrode; and a control unit controlling an electric potential of the second compound semiconductor layer.

In an aspect of a manufacturing method of a compound semiconductor device, over a first compound semiconductor layer of a first conductivity type, a second compound semiconductor layer of a second conductivity type different from the first conductivity type is formed, and thereafter, an electron transit layer is formed over the second compound semiconductor layer. Next, an electron supply layer is formed over the electron transit layer, and after that, a gate electrode and a source electrode are formed over the electron supply layer. Further, a drain electrode is formed below the first compound semiconductor layer, and a control unit controlling an electric potential of the second compound semiconductor layer is formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 is a diagram illustrating an example of layout of a structure in which a plurality of GaN-based HEMTs is integrated;

FIG. 3 is a diagram illustrating another example of layout of the structure in which the plurality of GaN-based HEMTs is integrated;

FIG. 4B is a graph illustrating a distribution of carrier density below the gate electrode 15 when a GaN-based HEMT is on;

DETAILED DESCRIPTION OF THE PREFERRED EMBODIMENTS

Hereinafter, embodiments will be specifically described while referring to the attached drawings.

First Embodiment

Figure 1:
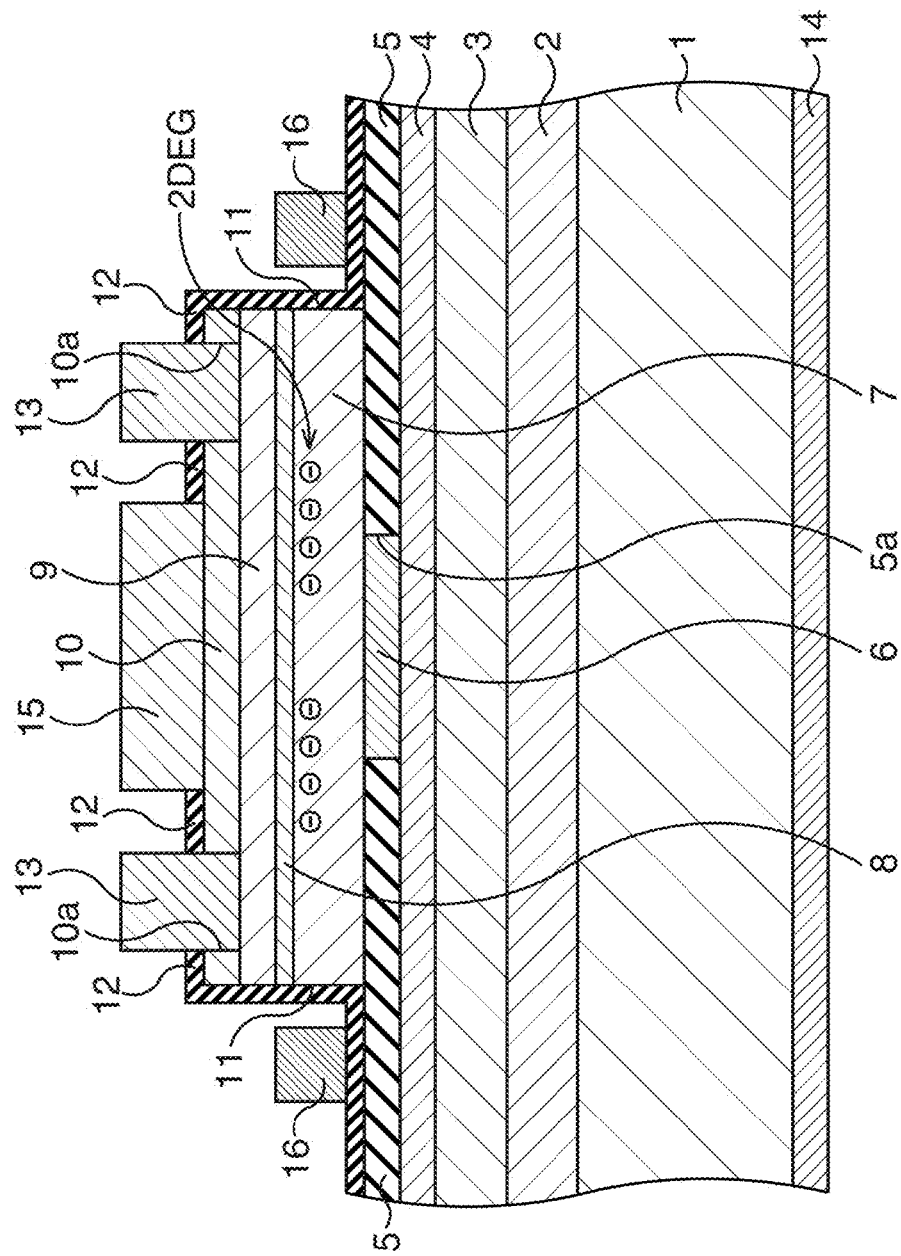
FIG. 1 is a sectional view illustrating a structure of a GaN-based HEMT according to a first embodiment.

First, description will be made on a first embodiment. FIG. 1 is a sectional view illustrating a structure of a GaN-based HEMT according to the first embodiment.

In the first embodiment, an AlN layer 2 and an n-type GaN layer 3 (first compound semiconductor layer) are formed on a substrate 1. The substrate 1 is, for example, an n-type silicon single crystal substrate. A thickness of the AlN layer 2 is about 1 μm to 10 μm. In the n-type GaN layer 3, Si is doped in an amount of about $1 \times 10^{17}$ cm$^{-3}$ to $1 \times 10^{20}$ cm$^{-3}$, and a thickness of the AlN layer 2 is about 1 μm to 10 μm.

On the n-type GaN layer 3, a p-type GaN layer 4 is formed as a current control layer (second compound semiconductor layer). In the p-type GaN layer 4, Mg is doped in an amount of about $1 \times 10^{17}$ cm$^{-3}$ to about $1 \times 10^{20}$ cm$^{-3}$, and a thickness of the p-type GaN layer 4 is preferably about 1 nm to 1 μm, for example. This is because, when the thickness is less than 1 nm, a sufficient withstand voltage may not be obtained, and when it is greater than 1 μm, on-resistance increases, resulting in that a current density when the HEMT is on is decreased.

On the p-type GaN layer 4, a silicon oxide film 5 having an opening 5a is formed as a current confinement layer (current block layer). A planar shape of the opening 5a as a current passing area is a rectangle whose length and width are, for example, 0.5 μm and 500 μm, respectively. Further, a thickness of the silicon oxide film 5 is about 10 nm to 1000 nm.

Further, an n-type GaN layer 6 is formed inside the opening 5a. Similar to the n-type GaN layer 3, Si is doped in the n-type GaN layer 6 in an amount of about $1 \times 10^{17}$ cm$^{-3}$ to $1 \times 10^{19}$ cm$^{-3}$.

In addition, on the silicon oxide film 5 and the n-type GaN layer 6, a non-doped GaN layer 7, a non-doped AlGaN layer 8, an n-type AlGaN layer 9 and an n-type GaN layer 10 are formed, and an element isolation trench 11 is formed in these layers. A thickness of the GaN layer 7 is about 0.05 μm to 5 μm, and the GaN layer 7 functions as an electron transit layer. A thickness of the AlGaN layer 8 is about 1 nm to 20 nm. In the n-type AlGaN layer 9, Si is doped in an amount of about $1 \times 10^{17}$ cm$^{-3}$ to $1 \times 10^{19}$ cm$^{-3}$, and a thickness of the n-type AlGaN layer 9 is about 5 nm to 50 nm. The n-type AlGaN layer 9 functions as an electron supply layer supplying electrons to the GaN layer 7 (electron transit layer), and the AlGaN layer 8 functions as a spacer layer separating the GaN layer 7 (electron transit layer) and the n-type AlGaN layer 9 (electron supply layer) from each other. Since a band gap of the AlGaN layer 8 is wide, a deep potential well is formed in the vicinity of an interface of the GaN layer 7 with the AlGaN layer 8, and two-dimensional electron gas 2DEG is generated there. In the n-type GaN layer 10, Si is doped in an amount of about $1 \times 10^{17}$ cm$^{-3}$ to $1 \times 10^{19}$ cm$^{-3}$, and a thickness of the n-type GaN layer 10 is about 1 nm to 20 nm.

Further, a silicon nitride film 12 is formed on the n-type GaN layer 10. An opening for gate electrode is formed on a center portion of the silicon nitride film 12, in plan view, and further, there is formed an opening for source electrode surrounding the opening for gate electrode. In the n-type GaN layer 10, there is formed an opening 10a that matches the opening for source electrode of the silicon nitride film 12.

Further, a gate electrode 15 is formed inside the opening for gate electrode of the silicon nitride film 12, and a source electrode 13 is formed inside the opening for source electrode of the silicon nitride film 12 and the opening 10a of the n-type GaN layer 10. Further, a drain electrode 14 is formed on a rear surface of the substrate 1. Furthermore, there is formed a control electrode 16 controlling an electric potential of the p-type GaN layer 4, on the silicon oxide film 5 inside the element isolation trench 11.

In a manner as described above, one piece of GaN-based HEMT is structured. Further, such GaN-based HEMTs are provided so as to be arranged in two directions orthogonal to each other via the element isolation trenches 11, as illustrated in FIG. 2. Further, it is also possible that such GaN-based HEMTs are provided so as to be arranged in one direction via the element isolation trenches 11, as illustrated in FIG. 3.

Further, when the aforementioned GaN-based HEMT is set to be in an off state by applying no voltage to the gate electrode 15, an electric potential of the gate electrode 15 and the control electrode 16 is set to be equal to an electric potential of the source electrode 13. As a result of performing such control, electrons cannot enter inside the p-type GaN layer 4, and a normally-off operation is secured. This is because the conductivity type of the p-type GaN layer 4 is the p-type, a band of a conduction band is increased, and an existence probability of electrons is significantly small. On the other hand, when the aforementioned GaN-based HEMT is set to be in an on state, in order to increase a current value, a voltage of 1 V, for example, is applied to the gate electrode 15, and a predetermined voltage, which is, a voltage of 5 V, for example, is applied to the control electrode 16. By performing such control, current flows through the p-type GaN layer 4, and further, it becomes possible to control a current amount in the gate electrode 15. The normally-off operation will be described next in detail. Further, a current collapse phenomenon, in which the on-resistance is changed during the operation, is suppressed by functions of the n-type GaN layer 10 and the silicon nitride film 12.

Figure 4A:
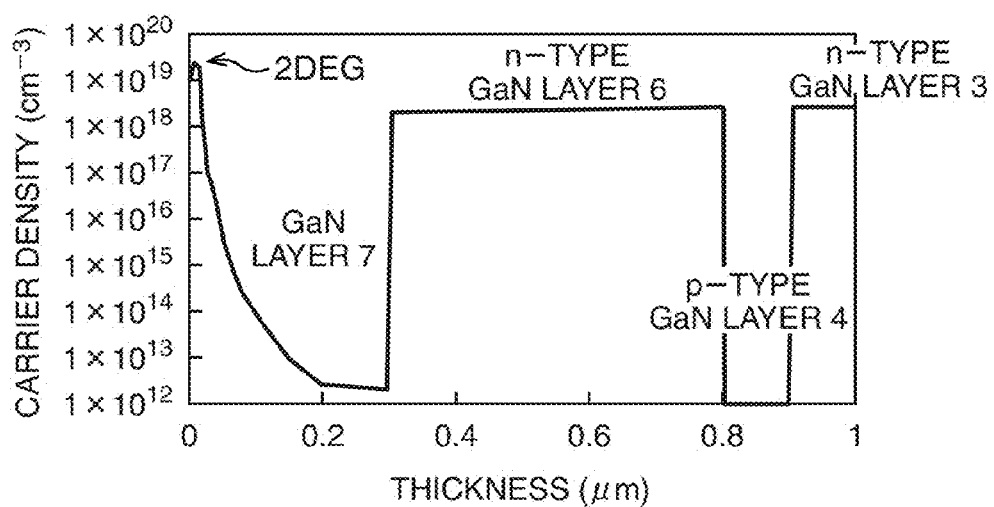
FIG. 4A is a graph illustrating a distribution of carrier density below a gate electrode 15 when a GaN-based HEMT is off.

FIG. 4A is a graph illustrating a distribution of carrier density below the gate electrode 15 when the GaN-based HEMT (thickness of p-type GaN layer 4: 100 nm) is off. As illustrated in FIG. 4A, when the HEMT is off, the carrier density in the GaN layer 7 decreases with increasing depth, and the carrier density increases in the n-type GaN layer 6. Further, the carrier density becomes quite small in the p-type GaN layer 4 (current control layer), and it again rapidly increases in the n-type GaN layer 3. Since there is such a distribution of carrier density, even when the voltage is applied to the gate electrode 15, no current flows between the source electrode 13 and the drain electrode 14.

Figure 4B:
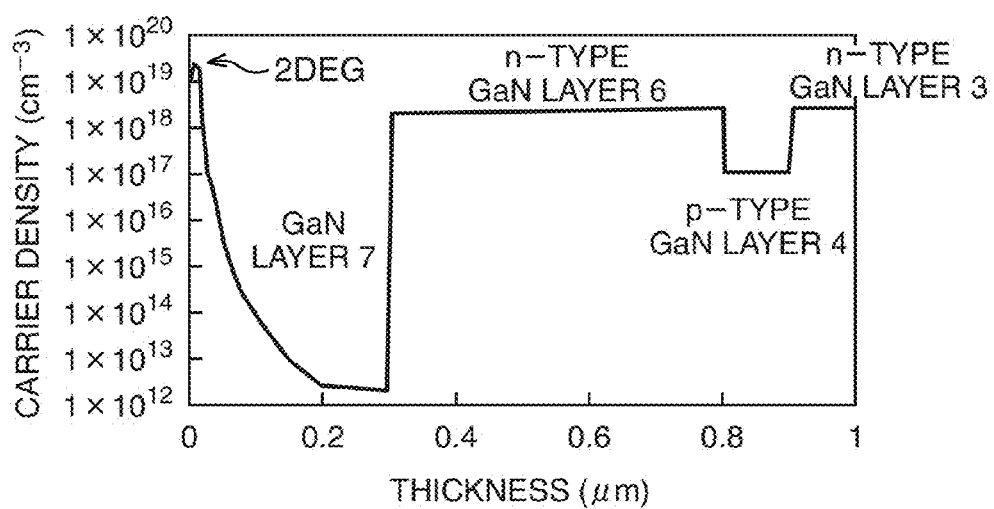

FIG. 4B is a graph illustrating a distribution of carrier density below the gate electrode 15 when the GaN-based HEMT (thickness of p-type GaN layer 4: 100 nm) is on. As illustrated in FIG. 4B, when the HEMT is on, because of an influence of the voltage applied to the control electrode 16, the carrier density in the p-type GaN layer 4 becomes significantly higher than that when the HEMT is off. Accordingly, when a predetermined voltage is applied to the gate electrode 15, current flows between the source electrode 13 and the drain electrode 14.

Next, description will be made on a method of manufacturing the GaN-based HEMT as described above. FIG. 5A to FIG. 5M are sectional views illustrating a manufacturing method of the GaN-based HEMT according to the first embodiment, in order of processes.

Figure 5A:
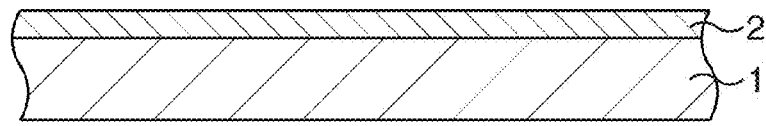
FIG. 5A is a sectional view illustrating a manufacturing method of a GaN-based HEMT according to a first embodiment.

First, as illustrated in FIG. 5A, the AlN layer 2 is formed on the substrate 1 using a halide vapor phase epitaxy (HYPE) method.

Figure 6:
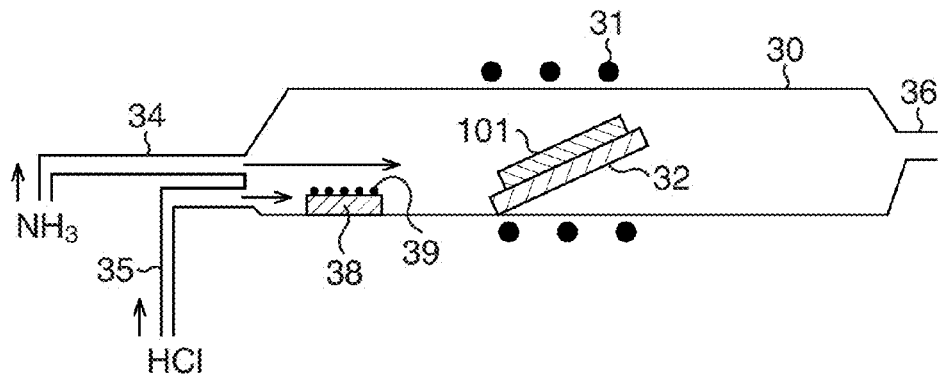
FIG. 6 is a diagram illustrating a structure of an HVPE apparatus.

Here, description will be made on an HVPE apparatus. FIG. 6 is a diagram illustrating a structure of the HVPE apparatus. A high-frequency coil 31 for induction heating is wound around a reaction tube 30 made of quartz, and inside the tube, there is disposed a carbon susceptor 32, on which a substrate 101 is placed. Two gas introduction pipes 34 and 35 are connected to an upstream end of the reaction tube 30 (end portion on the left side in FIG. 6), and one gas exhaust pipe 36 is connected to a downstream end of the reaction tube 30 (end portion on the right side in FIG. 6). A boat 38 is disposed inside the reaction tube 30 on an upstream side of the susceptor 32, and inside the boat, a source 39 of a group III element for compound to be grown is accommodated. The source 39 is, for example, Al when an AlN layer is formed through crystal growth. Ammonia ($NH_3$) gas as N source gas is introduced from the gas introduction pipe 34, and hydrogen chloride (HCl) gas is introduced from the gas introduction pipe 35. The HCl gas reacts with the group III source 39 in the boat 38 to generate group III element chloride (AlCl or the like) as source gas. The source gas (AlCl gas or the like) and the $NH_3$ gas are transferred onto the substrate 101 and react on a surface of the substrate 101 to grow the AlN layer or the like. Surplus gas is exhausted from the gas exhaust pipe 36 to a detoxification tower. Note that when a GaN layer is formed through crystal growth, the source 39 is Ga, and source gas as the group III element chloride is GaCl.

For example, conditions when the AlN layer 2 is formed are set as described below:
pressure: atmospheric pressure;
flow rate of HCl gas: 100 ccm (100 cm/min);
flow rate of $NH_3$ gas: 10 lm (10 liters/min); and
temperature: 1100° C.

Figure 5B:
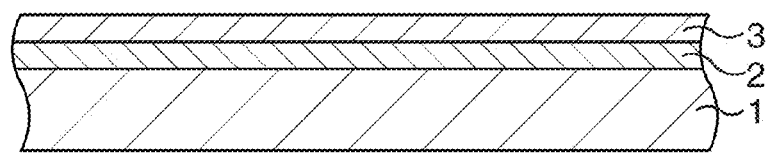
FIG. 5B is a sectional view illustrating the manufacturing method of a GaN-based HEMT continued from FIG. 5A.

After the AlN layer 2 is formed, the n-type GaN layer 3 is formed on the AlN layer 2 using a metal organic chemical vapor deposition (MOCVD) method, as illustrated in FIG. 5B.

Figure 7:
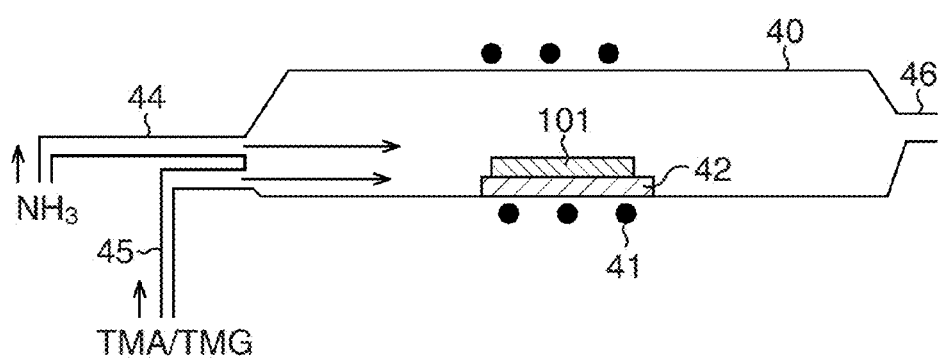
FIG. 7 is a diagram illustrating a structure of an MOCVD apparatus.

Here, description will be made on an MOCVD apparatus. FIG. 7 is a diagram illustrating a structure of the MOCVD apparatus. A high-frequency coil 41 is disposed around a reaction tube 40 made of quartz, and inside the reaction tube 40, there is disposed a carbon susceptor 42, on which a substrate 101 is placed. Two gas introduction pipes 44 and 45 are connected to an upstream end of the reaction tube 40 (end portion on the left side in FIG. 7), and source gases for compound are supplied from the pipes. For example, $NH_3$ gas as N source gas is introduced from the gas introduction pipe 44, and organic group III compound source material such as trimethylaluminum (TMA), trimethylgallium (TMG) and trimethylindium (TMI) as group III element source gas is introduced from the gas introduction pipe 45. Crystal growth occurs on the substrate 101, and surplus gas is exhausted from the gas exhaust pipe 46 to a detoxification tower. Note that if the crystal growth using the MOCVD method is performed in a reduced pressure atmosphere, the gas exhaust pipe 46 is connected to a vacuum pump, and an exhaust port of the vacuum pump is connected to the detoxification tower. The MOCVD apparatus is used not only for the formation of n-type GaN layer 3 but also for the formation of p-type GaN layer 4 and the like.

For example, conditions when the n-type GaN layer 3 is formed are set as described below:
flow rate of trimethylgallium (TMG): 0 to 50 sccm;
flow rate of trimethylaluminum (TMA): 0 to 50 sccm;
flow rate of trimethylindium (TMI): 0 to 50 sccm;
flow rate of ammonia ($NH_3$): 20 slm;
n-type impurity: silane ($SiH_4$);
pressure: 100 Torr; and
temperature: 1100° C.

For example, conditions when forming the p-type GaN layer 4 and the like are set as described below:
flow rate of trimethylgallium (TMG): 0 to 50 sccm;
flow rate of trimethylaluminum (TMA): 0 to 50 sccm;
flow rate of trimethylindium (TMI): 0 to 50 sccm;
flow rate of ammonia ($NH_3$): 20 slm;
p-type impurity: biscyclopentadienyl magnesium (Cp2Mg);
pressure: 100 Torr; and
temperature: 1100° C.

Note that when a silicon substrate is used as the substrate 1, even when the AlN layer 2 is formed, a GaN layer hardly grows on the AlN layer 2. For this reason, it is preferable to form, in an early stage of the formation of n-type GaN layer 3, an AlGaN layer (not illustrated) containing 10 atom % (at %) of Al.

Figure 5C:
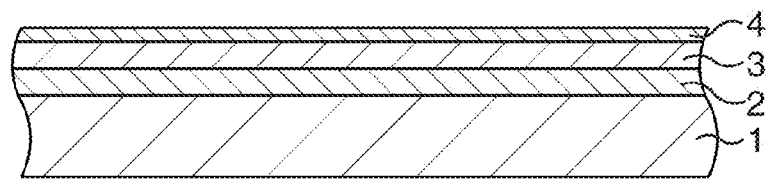
FIG. 5C is a sectional view illustrating the manufacturing method of a GaN-based HEMT continued from FIG. 5B.

After the n-type GaN layer 3 is formed, the p-type GaN layer 4 (current control layer) is formed on the n-type GaN layer 3 through the MOCVD method, as illustrated in FIG. 5C.

Figure 5D:
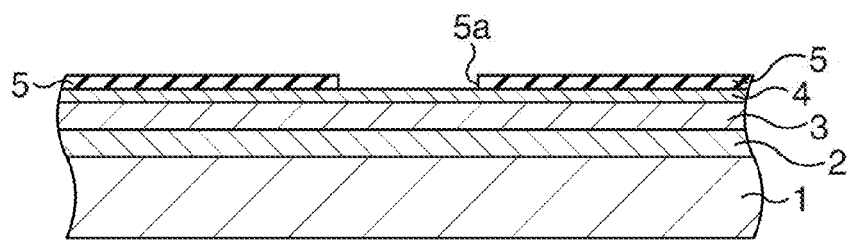
FIG. 5D is a sectional view illustrating the manufacturing method of a GaN-based HEMT continued from FIG. 5C.

Next, as illustrated in FIG. 5D, the silicon oxide film 5 (current confinement layer) having the opening 5a is formed on the p-type GaN layer 4. Regarding the formation of such a silicon oxide film 5, for example, a silicon oxide film is formed on the entire surface of the p-type GaN layer 4, a resist pattern is formed on the silicon oxide film for exposing a region on which the opening 5a is to be formed, and etching is performed on the silicon oxide film by using the resist pattern as a mask. After that, the resist pattern is removed.

Figure 5E:
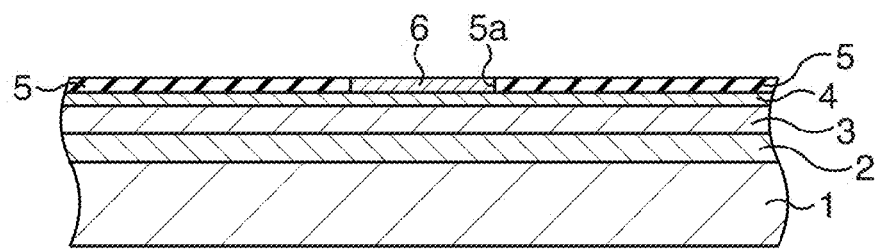
FIG. 5E is a sectional view illustrating the manufacturing method of a GaN-based HEMT continued from FIG. 5D.

Subsequently, as illustrated in FIG. 5E, the n-type GaN layer 6 is formed inside the opening 5a with the use of the MOCVD. Note that the n-type GaN layer 6 grows, by selective growth, in a thickness direction on the p-type GaN layer 4 exposed from the opening 5a, and it does not grow in a thickness direction on the silicon oxide film 5.

Figure 5F:
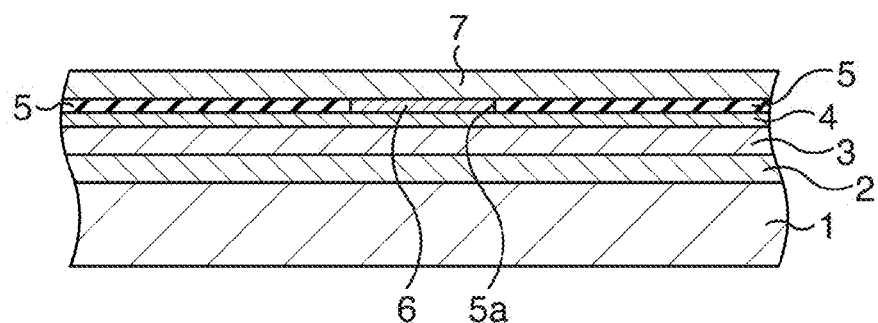
FIG. 5F is a sectional view illustrating the manufacturing method of a GaN-based HEMT continued from FIG. 5E.

Next, as illustrated in FIG. 5F, the non-doped GaN layer 7 (electron transit layer) is formed on the silicon oxide film 5 and the n-type GaN layer 6 through the MOCVD method. The GaN layer 7 grows in a thickness direction on the n-type GaN layer 6, and it also grows in a lateral direction from a portion grown in the thickness direction.

Figure 5G:
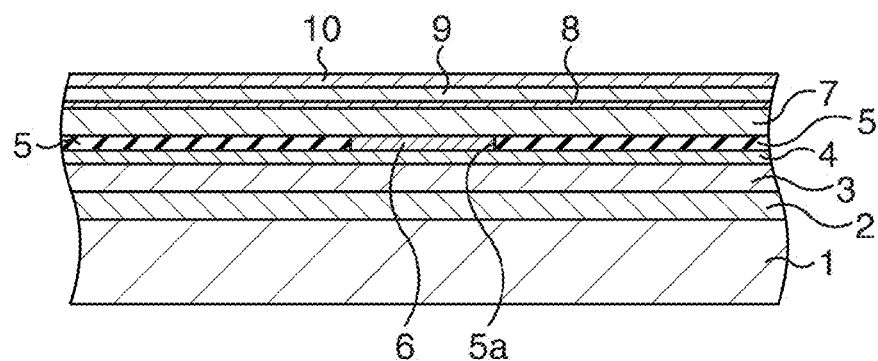
FIG. 5G is a sectional view illustrating the manufacturing method of a GaN-based HEMT continued from FIG. 5F.

Thereafter, as illustrated in FIG. 5G, the non-doped AlGaN layer 8, the n-type AlGaN layer 9 and the n-type GaN layer 10 are formed in this order on the GaN layer 7 through the MOCVD method.

Figure 5H:
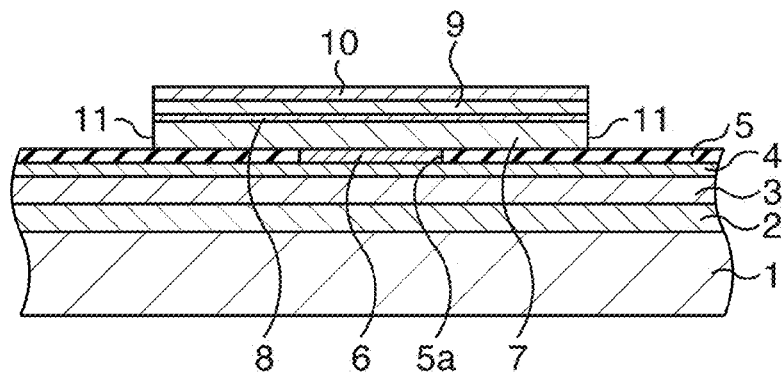
FIG. 5H is a sectional view illustrating the manufacturing method of a GaN-based HEMT continued from FIG. 5G.

Subsequently, as illustrated in FIG. 5H, the element isolation trench 11 is formed, using recess etching, in the n-type GaN layer 10, the n-type AlGaN layer 9, the AlGaN layer 8 and the GaN layer 7.

Figure 5I:
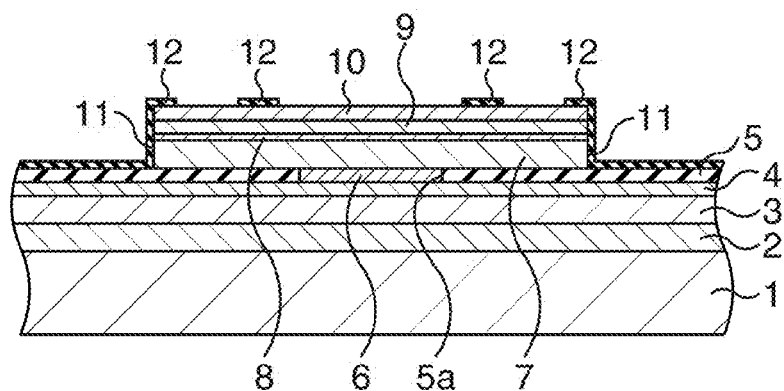
FIG. 5I is a sectional view illustrating the manufacturing method of a GaN-based HEMT continued from FIG. 5H.

Next, as illustrated in FIG. 5I, the silicon nitride film 12 is formed on the entire surface on a front surface side of the substrate 1 through a plasma CVD method, and on the silicon nitride film 12, the opening for gate electrode and the opening for source electrode are formed. When these openings are formed, selective etching using $SF_6$ gas is performed by using a resist pattern as a mask.

Figure 5J:
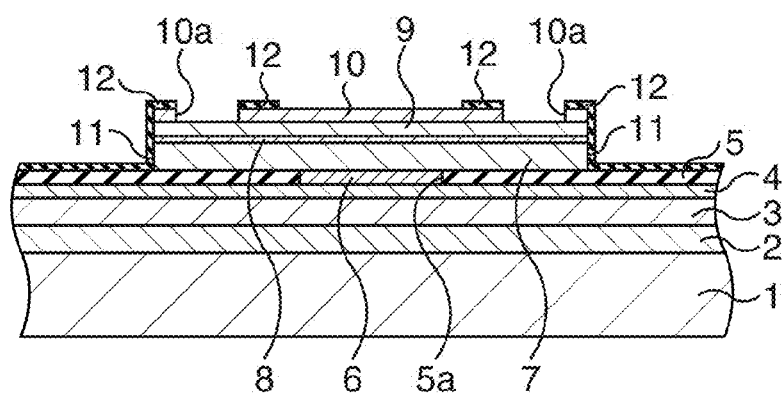
FIG. 5J is a sectional view illustrating the manufacturing method of a GaN-based HEMT continued from FIG. 5I.

After that, as illustrated in FIG. 5J, etching under time control using chlorine gas is performed on a portion of the n-type GaN layer 10 exposed from the opening for source electrode, thereby forming the opening 10a.

Figure 5K:
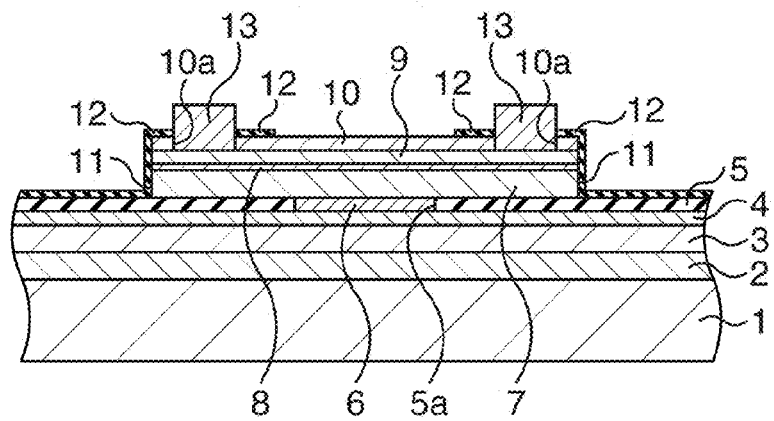
FIG. 5K is a sectional view illustrating the manufacturing method of a GaN-based HEMT continued from FIG. 5J.

Subsequently, as illustrated in FIG. 5K, the source electrode 13 is formed inside the opening for source electrode of the silicon nitride film 12 and the opening 10a of the n-type GaN layer 10 using, for example, a lift-off method. When the source electrode 13 is formed, a Ta film is formed, and an Al film is formed on the Ta film.

Figure 5L:
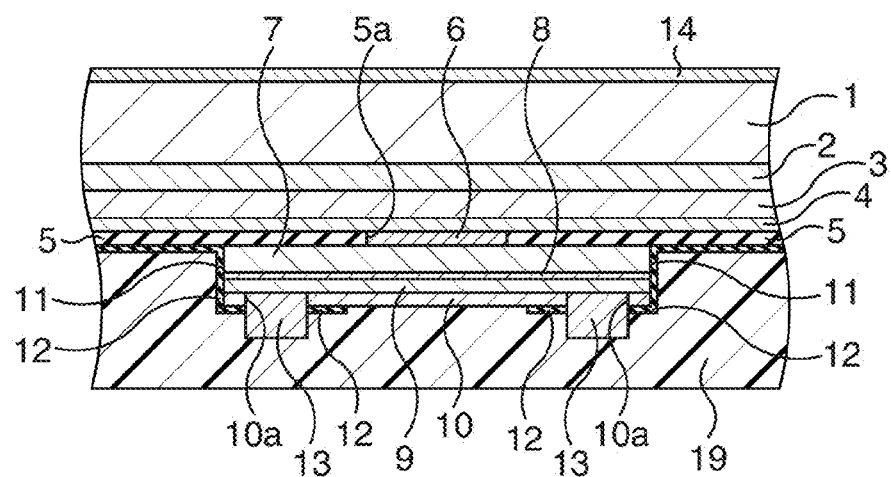
FIG. 5L is a sectional view illustrating the manufacturing method of a GaN-based HEMT continued from FIG. 5K.

Next, as illustrated in FIG. 5L, a surface protecting layer 19 is formed on the entire surface on the front surface side of the substrate 1, and the front and the rear of the substrate 1 are inverted. Thereafter, by polishing the rear surface of the substrate 1, a thickness of the substrate 1 is set to a predetermined thickness, according to need. Further, the drain electrode 14 is formed on the entire rear surface of the substrate 1.

Figure 5M:
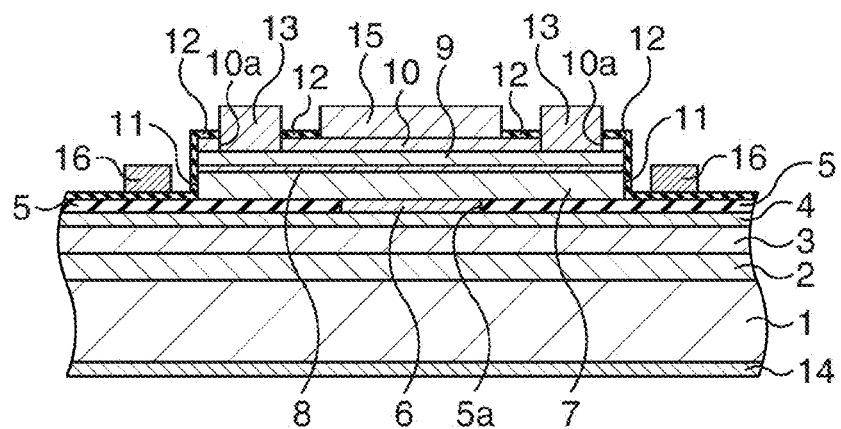
FIG. 5M is a sectional view illustrating the manufacturing method of a GaN-based HEMT continued from FIG. 5L.

Subsequently, as illustrated in FIG. 5M, the front and the rear of the substrate 1 are inverted, and the surface protecting layer 19 is removed. Next, with the use of the lift-off method, for example, the gate electrode 15 is formed inside the opening for gate electrode of the silicon nitride film 12, and the control electrode 16 is formed on the exposed silicon oxide film 5. When the gate electrode 15 and the control electrode 16 are formed, a Ni film is formed, and an Au film is formed on the Ni film.

As described above, the GaN-based HEMT is formed. After that, a passivation film, an external electrode, and so on are formed according to need, thereby completing a semiconductor device in which the GaN-based HEMTs are integrated.

Second Embodiment

Figure 8:
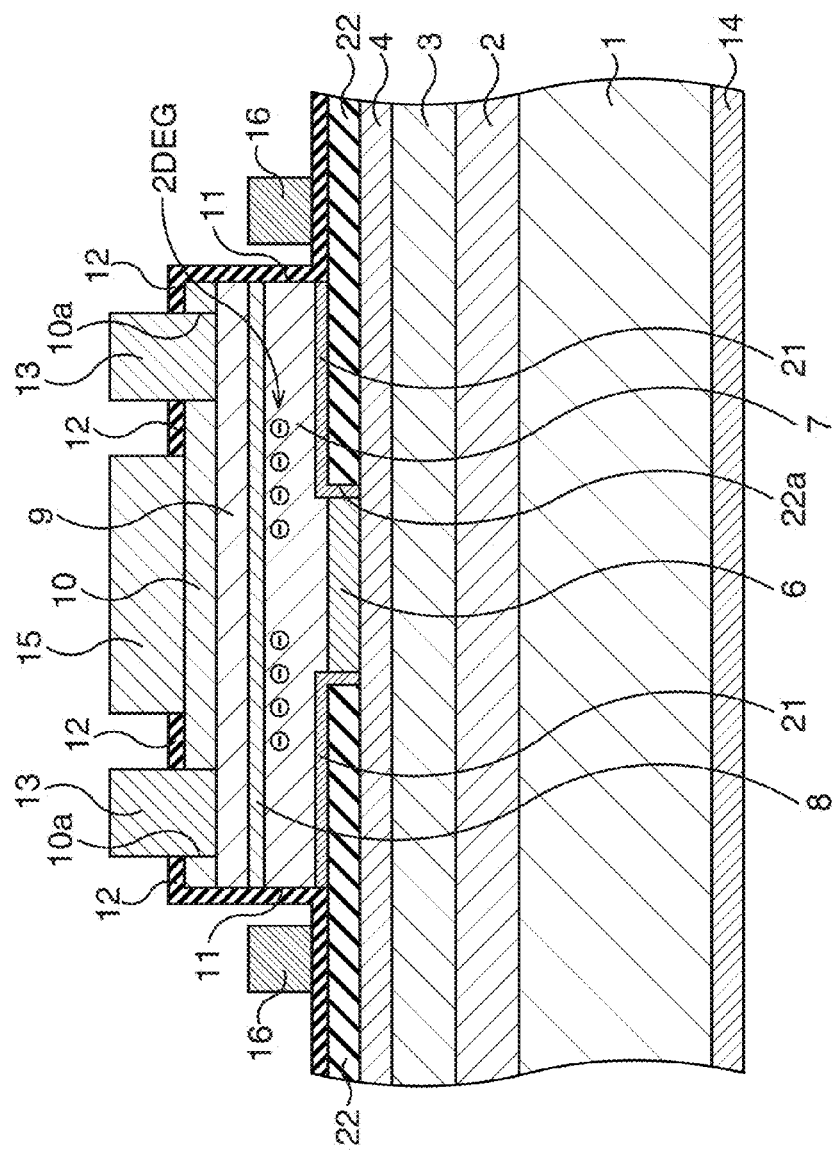
FIG. 8 is a sectional view illustrating a structure of a GaN-based HEMT according to a second embodiment.

Next, a second embodiment will be described. FIG. 8 is a sectional view illustrating a structure of a GaN-based HEMT according to the second embodiment.

In the second embodiment, there is provided an aluminum nitride film (AlN film) 22 having an opening 22a formed therein, instead of the silicon oxide film 5. Further, although the n-type GaN layer 6 and the GaN layer 7 are directly brought into contact with the silicon oxide film 5 in the first embodiment, in the second embodiment, there is formed an n-type AlGaN layer 21 between the n-type GaN layer 6 and the aluminum nitride film 22, and between the GaN layer 7 and the aluminum nitride film 22. In the n-type AlGaN layer 21, Si is doped in an amount of about $1.0 \times 10^{17}$ $cm^{-3}$ to $1.0 \times 10^{19}$ $cm^{-3}$, and a thickness of the n-type AlGaN layer 21 is about 1 nm to 50 nm. The other structure is the same as that of the first embodiment.

In such a second embodiment, a fixed negative electric charge is generated in the vicinity of an interface of the GaN layer 7 with the n-type AlGaN layer 21. The electric charge is a piezo-electric charge generated due to a difference in lattice constants between GaN and AlGaN. Further, since electrons are repulsed by the negative electric charge, it becomes difficult for the electrons to exist in a current confinement portion (opening 22a), resulting in that a current in the current confinement portion is significantly decreased. Meanwhile, when a positive voltage is applied to the control electrode 16, an electric potential of the p-type GaN layer 4 increases, and only after that, the electrons are allowed to exist in the current confinement portion, which lets the current flow. As above, the current does not flow via the current confinement portion unless the voltage is applied to the control electrode 16, and the current starts to flow when the voltage is applied to the electrode, so that the normally-off operation is more securely conducted. Further, two-dimensional electron gas is generated also in the vicinity of an interface of the n-type GaN layer 6 with the n-type AlGaN layer 21, and the current flows through that portion as well. Accordingly, the on-resistance at the time of operation is reduced.

Third Embodiment

Figure 9:
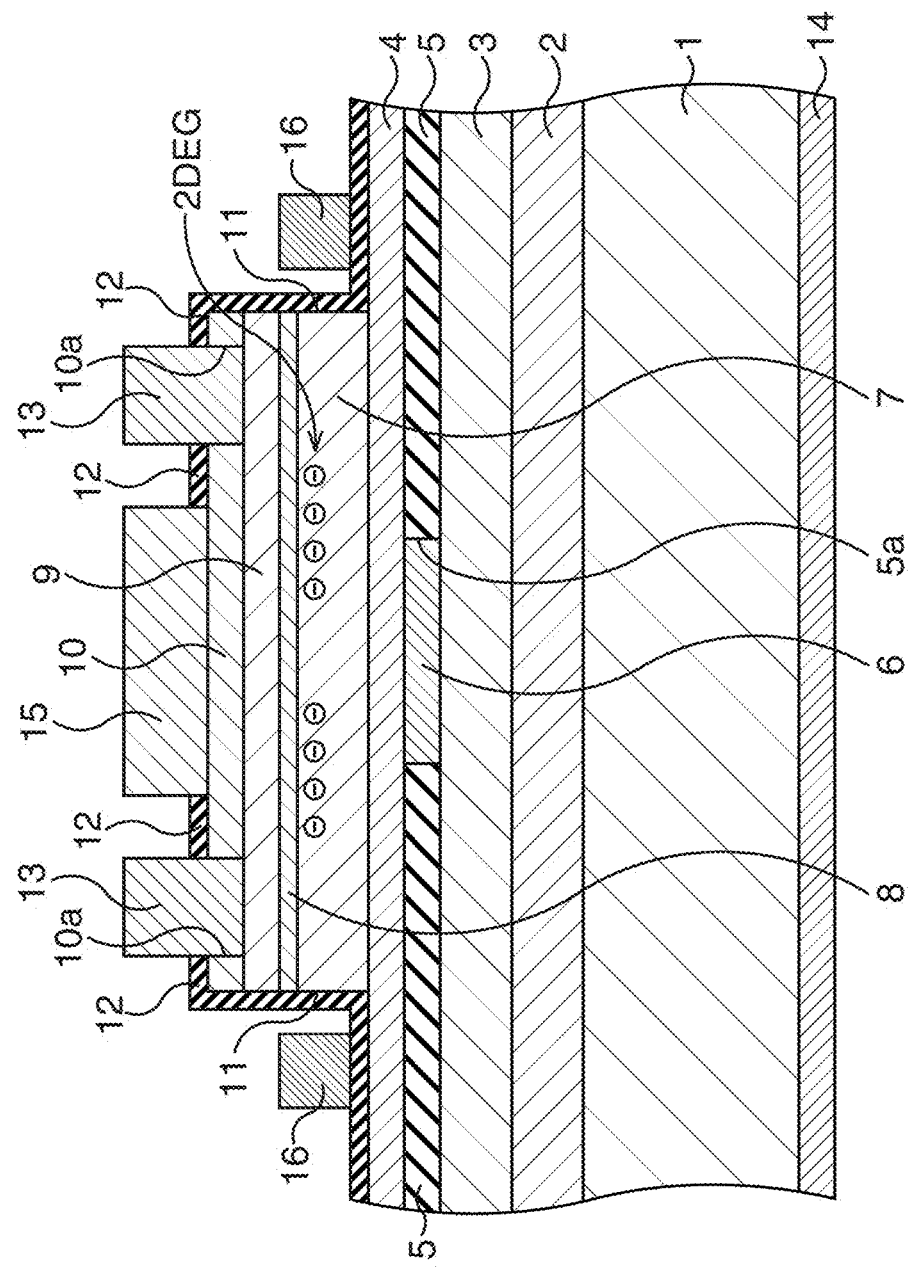
FIG. 9 is a sectional view illustrating a structure of a GaN-based HEMT according to a third embodiment.

Next, a third embodiment will be described. FIG. 9 is a sectional view illustrating a GaN-based HEMT according the third embodiment.

In the third embodiment, the silicon oxide film 5 and the n-type GaN layer 6 are formed so as to be brought into contact with the n-type GaN layer 3, and the p-type GaN layer 4 is formed on the silicon oxide film 5 and the n-type GaN layer 6. Specifically, a stacking relationship between the p-type GaN layer 4 and a combination of the silicon oxide film 5 and the n-type GaN layer 6 is opposite to that of the first embodiment. The other structure is the same as that of the first embodiment.

Also in such a third embodiment, it is possible to achieve the same effect as that of the first embodiment. Further, in the third embodiment, since the p-type GaN layer 4 is close to a 2DEG region, a depletion layer extends to the 2DEG region, which enables to decrease an off current.

Fourth Embodiment

Figure 10:
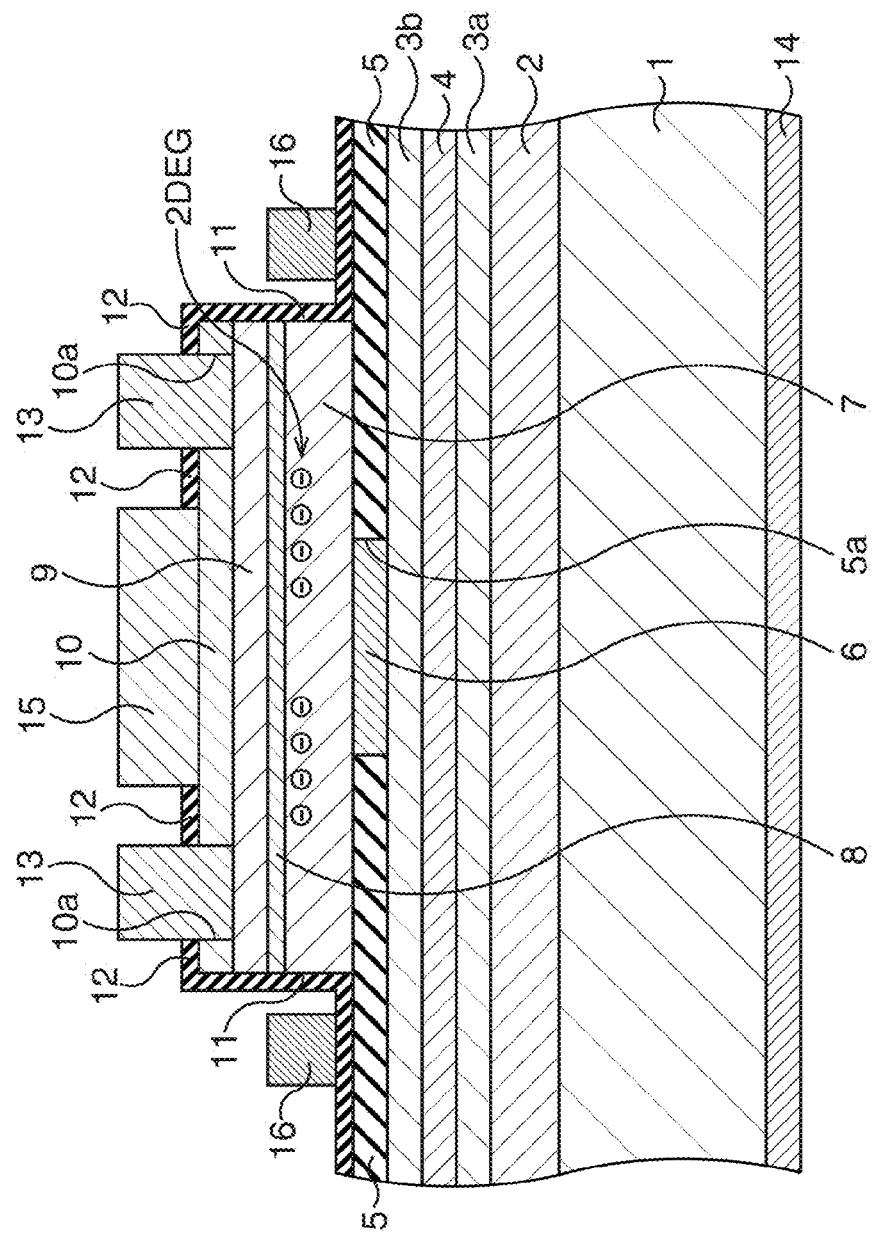
FIG. 10 is a sectional view illustrating a structure of a GaN-based HEMT according to a fourth embodiment.

Next, a fourth embodiment will be described. FIG. 10 is a sectional view illustrating a structure of a GaN-based HEMT according to the fourth embodiment.

In the fourth embodiment, there are provided n-type GaN layers 3a and 3b instead of the n-type GaN layer 3, and the p-type GaN layer 4 is provided between the n-type GaN layers 3a and 3b. Namely, the n-type GaN layer 3a is formed on the AlN layer 2, the p-type GaN layer 4 is formed on the n-type GaN layer 3a, and the n-type GaN layer 3b is formed on the p-type GaN layer 4. The other structure is the same as that of the first embodiment.

Also in such a fourth embodiment, it is possible to achieve the same effect as that of the first embodiment. Further, in the fourth embodiment, the p-type GaN layer 4 is not etched, so that crystallinity thereof is likely to be maintained at a high level. As a result of this, the on-resistance can be further reduced, and further, it is possible to improve current stopping performance when the HEMT is off.

Note that in order to efficiently apply the voltage from the control electrode 16 to the p-type GaN layer 4, a portion of the n-type GaN layer 3b positioned between the control electrode 16 and the p-type GaN layer 4 is preferably removed. However, even if the n-type GaN layer 3b remains, since the n-type GaN layer 3b is very thin compared to an area of the control electrode 16, it is possible to apply the voltage from the control electrode 16 to the p-type GaN layer 4.

Fifth Embodiment

Figure 11:
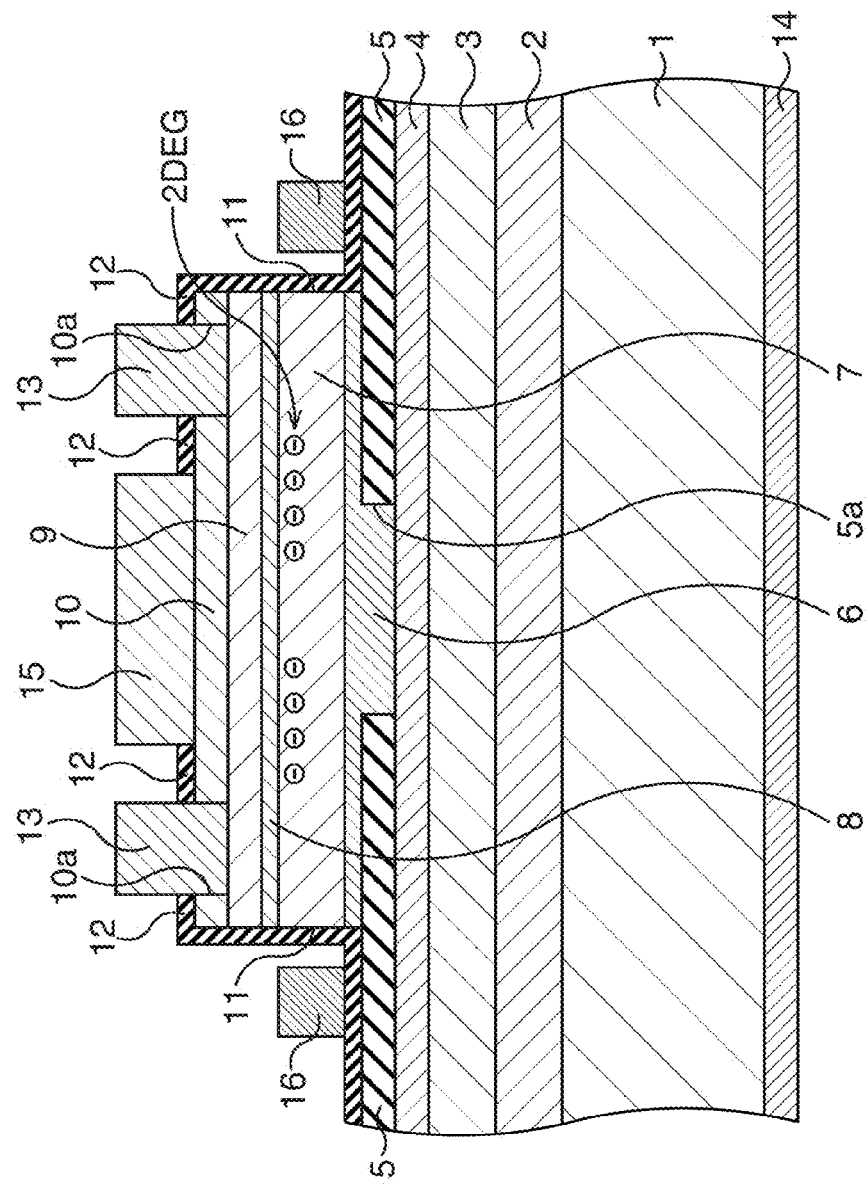
FIG. 11 is a sectional view illustrating a structure of a GaN-based HEMT according to a fifth embodiment.

Next, a fifth embodiment will be described. FIG. 11 is a sectional view illustrating a structure of a GaN-based HEMT according to the fifth embodiment.

In the fifth embodiment, the n-type GaN layer 6 is formed not only in the opening 5a but also on the silicon oxide film 5 in an extended manner. A thickness of the n-type GaN layer 6 in the present embodiment is about 500 nm. The n-type GaN layer 6 grows in a thickness direction in the opening 5a, and it then grows in a lateral direction from a portion grown in the thickness direction. The other structure is the same as that of the first embodiment.

Also in such a fifth embodiment, it is possible to achieve the same effect as that of the first embodiment. Further, in the fifth embodiment, since a contact area between the 2DEG region and the n-type GaN layer 6 is wide, the on-resistance is reduced. Note that it is also possible to use the n-type GaN layer 6 in the fifth embodiment as the n-type GaN layer 6 in the second to fourth embodiments.

Note that in any of the embodiments, the material, the thickness, the impurity concentration and so on of the substrate 1 and each of the layers are not particularly limited. For instance, as the substrate 1, it is also possible to use, other than the conductive silicon substrate, a conductive sapphire substrate, a conductive SiC substrate, a conductive GaN substrate or the like. Further, as the current confinement layer (current block layer), it is also possible to use a p-type GaN layer, other than the silicon oxide film and the aluminum nitride film.

However, etching of the p-type GaN layer is difficult, compared to the etching of the silicon oxide film and the aluminum nitride film, and a pinch-off characteristic is likely to be lowered. Further, since a lattice constant of the sapphire substrate is relatively largely different from lattice constants of a nitide-based compound semiconductor layer, dislocation is likely to be generated in the compound semiconductor layer and crystallinity is likely to be lowered. For this reason, it becomes difficult to achieve a desired characteristic. Therefore, a conductive semiconductor substrate is preferably used as the substrate, and a silicon oxide film or an aluminum nitride film is preferably used as the current confinement layer (current block layer).

Further, in any of the embodiments, it is also possible that the control electrode 16 and the p-type GaN layer 4 are directly brought into contact with each other.

Figure 12A:
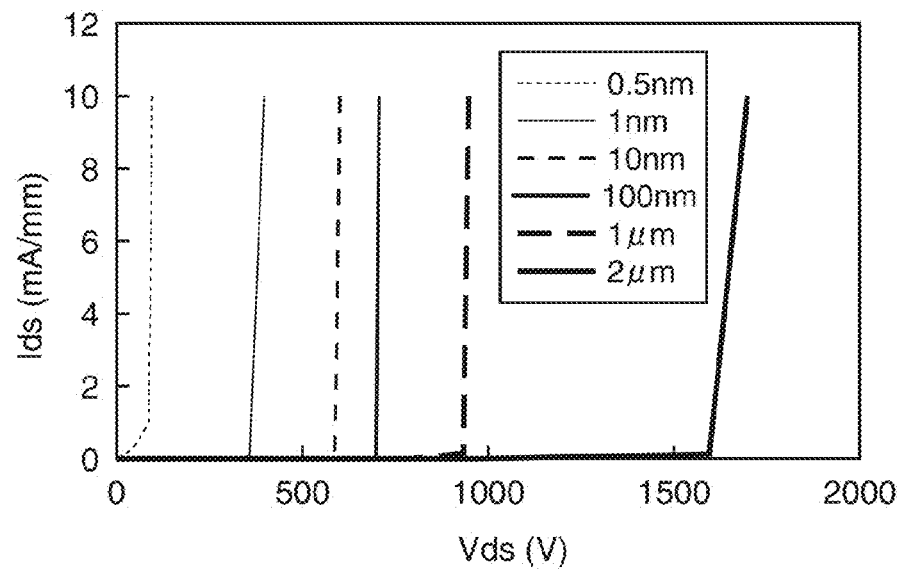
FIG. 12A is a graph illustrating I-V characteristics when GaN-based HEMTs in accordance with the first embodiment perform an off-operation.
Figure 12B:
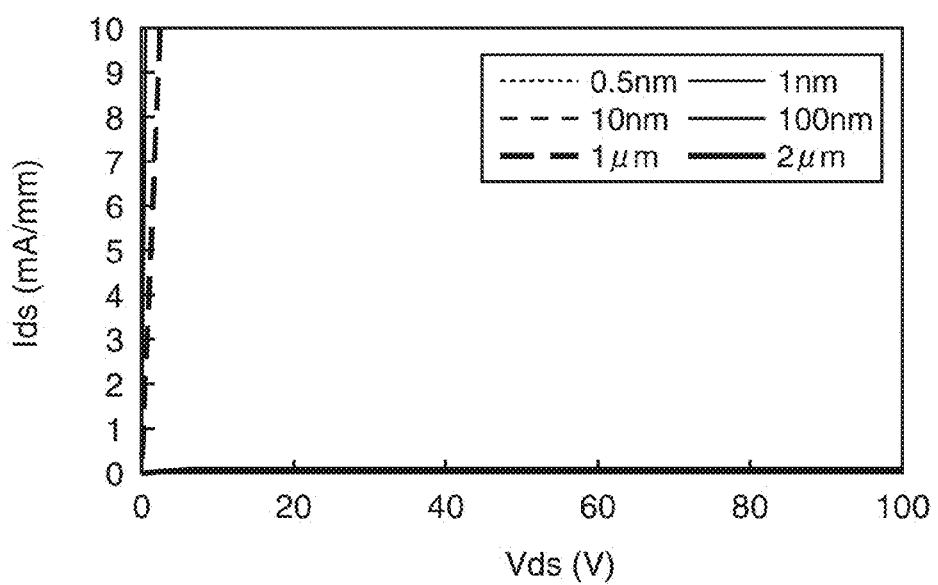
FIG. 12B is a graph illustrating I-V characteristics when GaN-based HEMTs in accordance with the first embodiment perform an on-operation.
Figure 13A:
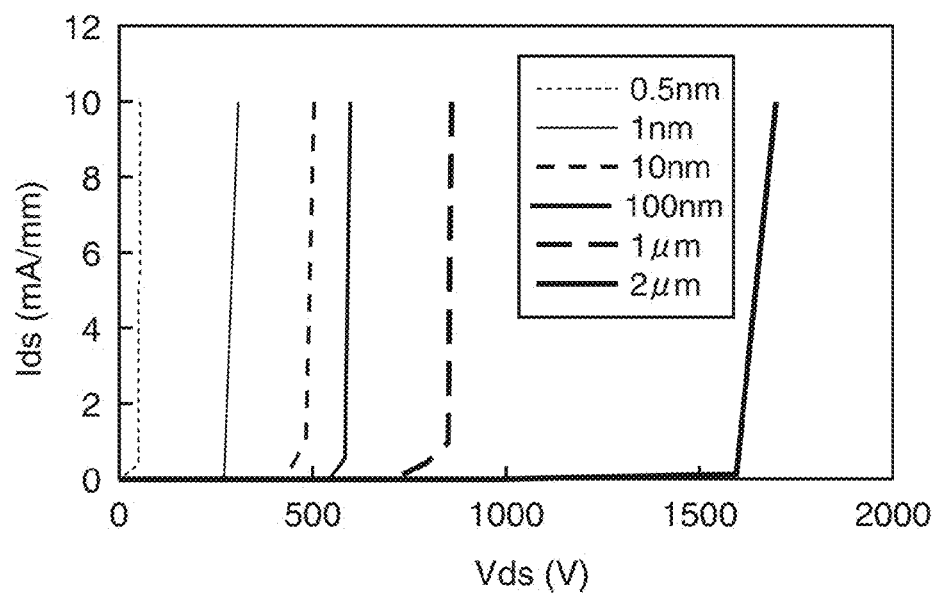
FIG. 13A is a graph illustrating I-V characteristics when GaN-based HEMTs in accordance with the third embodiment perform an off-operation.
Figure 13B:
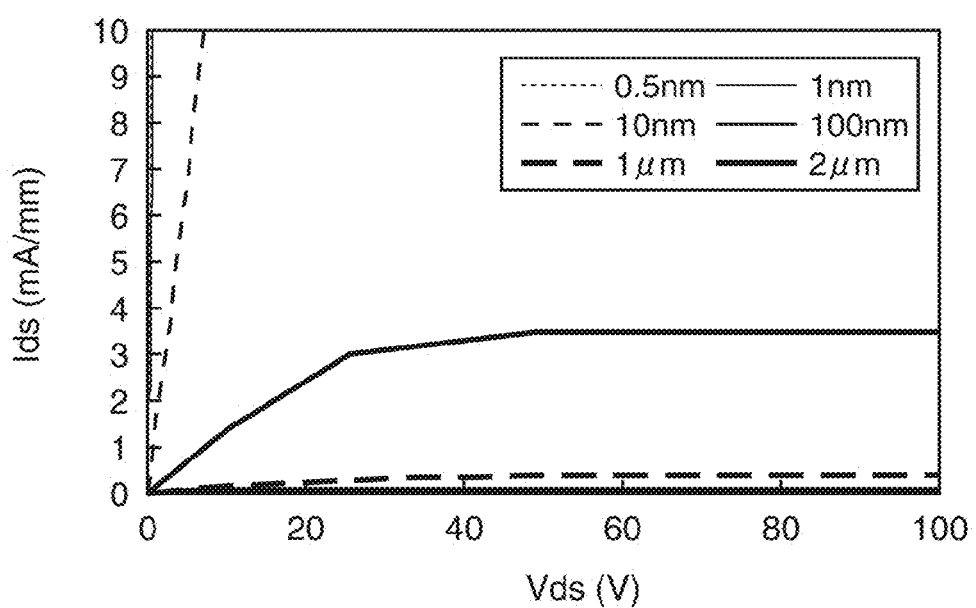
FIG. 13B is a graph illustrating I-V characteristics when GaN-based HEMTs in accordance with the third embodiment perform an on-operation.

Next, description will be made on experiments actually conducted by the present inventor. In the experiments, there were manufactured the GaN-based HEMTs in accordance with the first embodiment (refer to FIG. 1) and the GaN-based HEMTs in accordance with the third embodiment (refer to FIG. 9). At this time, thicknesses of the p-type GaN layer 4 were set to six kinds of 0.5 nm, 1 nm, 10 nm, 100 nm, 1 μm and 2 μm, and six pieces of samples, in total, were manufactured. Further, I-V characteristics of the respective samples were measured. Results thereof are illustrated in FIG. 12A, FIG. 12B, FIG. 13A and FIG. 13B. FIG. 12A and FIG. 12B illustrate characteristics when the GaN-based HEMTs in accordance with the first embodiment perform an off-operation and an on-operation, respectively. Further, FIG. 13A and FIG. 13B illustrate characteristics when the GaN-based HEMTs in accordance with the third embodiment perform an off-operation and an on-operation, respectively. In each graph, a horizontal axis indicates a voltage (Vds) applied between the source electrode 13 and the drain electrode 14, and a vertical axis indicates a density of current (Ids) flowed between the source electrode 13 and the drain electrode 14.

As illustrated in FIG. 12A and FIG. 13A, in the GaN-based HEMTs in accordance with either embodiment, when the thickness of the p-type GaN layer 4 was 1 nm, 10 nm, 100 nm or 1 μm, a normally-off operation was confirmed, and as illustrated in FIG. 12B and FIG. 13B, a current flowed at an appropriate density when the on-operation was performed. Meanwhile, as illustrated in FIG. 12A and FIG. 13A, the normally-off operation was not confirmed in the sample in which the thickness of the p-type GaN layer 4 was 0.5 nm. Further, as illustrated in FIG. 12B and FIG. 13B, in the sample in which the thickness of the p-type GaN layer 4 was 2 μm, the current density when the HEMT was on was very low. Therefore, it is conceivable that when the thickness of the p-type GaN layer 4 is not less than 1 nm nor more than 1 μm, the p-type GaN layer 4 can exhibit a sufficient current block characteristic when the HEMT is off, and besides, it can sufficiently reduce the on-resistance.

Note that the withstand voltage is high in the GaN-based HEMT in accordance with the first embodiment, and the resistance when the on-operation is performed is high in the GaN-based HEMT in accordance with the third embodiment. This is conceivable because in the GaN-based HEMT in accordance with the third embodiment, the formation of p-type GaN layer 4 is conducted after the selective growth of the n-type GaN layer 6, and a relatively large amount of defects are generated in a peripheral portion of the p-type GaN layer 4.

INDUSTRIAL APPLICABILITY

With the use of a compound semiconductor device and a manufacturing method thereof, it becomes possible to perform a normally-off operation. Accordingly, it also becomes possible to put the compound semiconductor device to practical use as a part of an automobile and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:
1. A compound semiconductor device, comprising:
a first compound semiconductor layer of a first conductivity type;
an electron transit layer formed over the first compound semiconductor layer;
an electron supply layer formed over the electron transit layer;
a gate electrode and a source electrode formed over the electron supply layer;
a drain electrode formed below the first compound semiconductor layer;

a second compound semiconductor layer of a second conductivity type different from the first conductivity type, formed between the electron transit layer and the drain electrode;

a control unit controlling an electric potential of the second compound semiconductor layer; and a current confinement layer comprising an opening and formed between the electron transit layer and the drain electrode, the current confinement layer being in contact with the second compound semiconductor layer, wherein the second compound semiconductor layer overlaps the opening.

2. The compound semiconductor device according to claim 1, further comprising a third compound semiconductor layer of the first conductivity type formed between the electron transit layer and the second compound semiconductor layer.

3. The compound semiconductor device according to claim 1, further comprising a third compound semiconductor layer of the first conductivity type formed inside the opening.

4. The compound semiconductor device according to claim 1, wherein the second compound semiconductor layer is positioned between the first compound semiconductor layer and the electron transit layer.

5. The compound semiconductor device according to claim 1, wherein the second compound semiconductor layer is positioned between the first compound semiconductor layer and the current confinement layer.

6. The compound semiconductor device according to claim 1, wherein the second compound semiconductor layer is positioned between the current confinement layer and the electron transit layer.

7. The compound semiconductor device according to claim 1, wherein:

the current confinement layer is an AlN layer;

the electron transit layer is a GaN layer; and the compound semiconductor device further comprises an n-type AlGaN layer formed between the current confinement layer and the electron transit layer.

8. The compound semiconductor device according to claim 1, further comprising a conductive substrate positioned between the first compound semiconductor layer and the drain electrode.

9. The compound semiconductor device according to claim 1, wherein a thickness of the second compound semiconductor layer is 1 nm to 1 µm.

10. A manufacturing method of a compound semiconductor device, comprising:

forming, over a first compound semiconductor layer of a first conductivity type, a second compound semiconductor layer of a second conductivity type different from the first conductivity type;

forming an electron transit layer over the second compound semiconductor layer;

forming an electron supply layer over the electron transit layer;

forming a gate electrode and a source electrode over the electron supply layer;

forming a drain electrode below the first compound semiconductor layer;

forming a control unit controlling an electric potential of the second compound semiconductor layer;

forming, before said forming the electron transit layer, a current confinement layer comprising an opening over the first compound semiconductor layer, the current confinement layer being in contact with the second compound semiconductor layer, wherein the second compound semiconductor layer overlaps the opening.

11. The manufacturing method of a compound semiconductor device according to claim 10, further comprising forming, between said forming the second compound semiconductor layer and said forming the electron transit layer, a third compound semiconductor layer of the first conductivity type over the second compound semiconductor layer.

12. The manufacturing method of a compound semiconductor device according to claim 10, further comprising forming a third compound semiconductor layer of the first conductivity type inside the opening.

13. The manufacturing method of a compound semiconductor device according to claim 10, wherein said forming the current confinement layer is conducted between said forming the second compound semiconductor layer and said forming the electron transit layer.

14. The manufacturing method of a compound semiconductor device according to claim 10, wherein said forming the current confinement layer is conducted before said forming the second compound semiconductor layer.

15. The manufacturing method of a compound semiconductor device according to claim 10, wherein:

an AlN layer is formed as the current confinement layer;

a GaN layer is formed as the electron transit layer; and the method further comprises forming, between said forming the current confinement layer and said forming the electron transit layer, an n-type AlGaN layer on the current confinement layer.

16. The manufacturing method of a compound semiconductor device according to claim 10, wherein a thickness of the second compound semiconductor layer is set to 1 nm to 1 µm.

* * * * *